United States Patent
Williams, III et al.

(10) Patent No.: US 7,176,821 B1
(45) Date of Patent: Feb. 13, 2007

(54) REDUCED AREA DIGITAL SIGMA-DELTA MODULATOR

(75) Inventors: Louis Albert Williams, III, Plano, TX (US); Francesco Cavaliere, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/242,685

(22) Filed: Oct. 3, 2005

(51) Int. Cl.
*H03M 3/00* (2006.01)

(52) U.S. Cl. ............... 341/143; 341/131; 341/118

(58) Field of Classification Search ......... 341/143, 341/118, 131, 139
See application file for complete search history.

(56) References Cited

U.S. PATENT DOCUMENTS

| | | | |
|---|---|---|---|
| 5,191,331 A * | 3/1993 | Karema et al. ........... 341/131 |
| 5,742,246 A * | 4/1998 | Kuo et al. ............... 341/143 |
| 5,757,301 A * | 5/1998 | Kuo et al. ............... 341/143 |
| 5,805,093 A * | 9/1998 | Heikkila et al. .......... 341/143 |
| 5,880,687 A * | 3/1999 | May et al. ............... 341/61 |
| 5,949,361 A * | 9/1999 | Fischer et al. ........... 341/143 |
| 6,107,947 A * | 8/2000 | Lyden ................... 341/143 |
| 6,501,406 B1 * | 12/2002 | Mecchia et al. .......... 341/143 |
| 7,049,990 B2 * | 5/2006 | Ranganathan ............ 341/143 |
| 2005/0093726 A1 * | 5/2005 | Hezar et al. ............. 341/143 |

OTHER PUBLICATIONS

Riley, T. A. D. et al., "Delta-Sigma Modulation in Fractional-*N* Frequency Synthesis", IEEE Journal of Solid-State Circuits, May 1993, pp. 553-559, vol. 28, No. 5.

* cited by examiner

*Primary Examiner*—Linh Nguyen
(74) *Attorney, Agent, or Firm*—Carlton H. Hoel; W. James Brady; Frederick J. Telecky, Jr.

(57) ABSTRACT

A digital sigma-delta modulator requiring minimal die area and dissipating minimal power is formed with a plurality of integration stages coupled in tandem between an input node and an output node. The bit width of signals in the integration stages is progressively reduced from the first to the last integration stage without compromising modulator accuracy. A quantizer between the last integration stage and the output node provides the final reduction of signal bit width. The gain of the modulator feedforward and feedback paths are integer powers of two to further simplify the digital computation. In an exemplary implementation, three integration stages to form a third-order modulator are coupled in tandem between the input node and the output node. The gains of feedback and feedforward paths in one preferred embodiment are unity, and in some embodiments, one feedforward path has gain of 0.5.

3 Claims, 3 Drawing Sheets

US 7,176,821 B1

REDUCED AREA DIGITAL SIGMA-DELTA MODULATOR

TECHNICAL FIELD

This invention relates generally to producing a digital sampled-data sequence for a signal, and in particular, to a method and implementation for implementing a digital sigma-delta modulator such as for a frequency synthesizer.

BACKGROUND

Local oscillators are used in radio-frequency (RF) transmitters and receivers and in other applications to produce an adjustable-carrier or heterodyning frequency. An oscillator with an adjustable frequency enables a transceiver to communicate over a chosen channel. The local oscillator is generally implemented as a voltage-controlled oscillator (VCO) so that its frequency can be adjusted by a variable applied voltage. VCOs are generally implemented with a resonant tank circuit using a fixed inductor and a capacitor that is controlled with a voltage. Varactor diodes, which are back-biased semiconductor diodes, can be used to provide a voltage-controlled capacitance to adjust the resonant frequency of a resonant tank circuit with a variable input voltage.

VCOs (voltage-controlled oscillators) are used in radio transmitters and receivers and in other applications such as test equipment to generate an adjustable, precisely controlled carrier frequency. In addition, the waveform from the VCO must exhibit excellent sinusoidal purity, particularly in communication applications. To achieve precise frequency control, a reference oscillator, usually relying on a piezoelectric crystal to assure frequency precision, generates a reference frequency, usually substantially lower in frequency than the frequency of the VCO. The frequency of the reference oscillator is compared to the VCO frequency by dividing the VCO frequency by a dividing factor N that is the ratio of the desired frequency of the VCO to the frequency of the reference oscillator. The frequency comparison after frequency division is made with a phase and frequency detector (PFD) that produces an error voltage as a measure of the phase and frequency difference. To set the frequency of the VCO, the dividing factor N can be controlled by a sigma-delta modulator using a phase-locked loop (PLL).

A VCO of the prior art with frequency controlled by a PLL is illustrated in the block diagram in FIG. 1. Reference oscillator 105, with frequency set by piezoelectric crystal 106, produces a signal with an accurate frequency $f_{ref}$. VCO 120 produces a signal with frequency $f_{VCO}$, controlled by the analog control signal 116, typically a voltage control signal. The frequency $f_{VCO}$ is divided by frequency divider 125 by the dividing factor N to produce a waveform with frequency $f_{VCO}/N$ that is compared by PFD 110 to produce phase and frequency error voltage 111. The error voltage 111 is filtered by loop filter 115 to produce control signal 116 for the VCO. The control signal 116 must be substantially steady and noise free to allow the VCO to produce a sinusoidal waveform with insubstantial bandwidth and with insignificant harmonics.

Dividing the frequency of an oscillator waveform by an integer dividing factor N is easily performed in processes well known in the art using a digital counter that is reset each time it counts N cycles. In the general case, however, to produce an arbitrary VCO frequency, the dividing factor N is not an integer. Division by non-integer "fractional-N" dividing factors using a digital counter is more difficult, but also well known in the art. The commonly used technique of dividing by a fractional-N factor, for example, the factor 118.6, uses a counter that counts to 118 for 40% of the time, and to 119 for 60% of the time in a substantially periodic, alternating sequence. The alternating sequence is generated by a sigma-delta modulator 130 controlled by an input signal $N_d$, 135 that represents a desired fractional-N dividing factor N. Loop filter 115 effectively averages the dithered and processed frequency-divided signal from the PFD by attenuating high-frequency noise, producing a substantially steady control signal 116 for the VCO. The result is an output waveform from the VCO with frequency $f_{VCO}$ dependent on the frequency of the reference oscillator and set by a fractional-N dividing factor N that may be input with multi-bit, digital precision.

Sigma-delta modulators, also referred to as delta-sigma modulators, are used to convert analog signals into a digital format. For example, sigma-delta modulators are often used in analog-to-digital (A/D) converters. Sigma-delta modulators are also used to reduce the "bit width", i.e., the word size, of band-limited digital signals by oversampling. For example, by oversampling a band-limited digital signal over the Nyquist sampling rate by a factor of $16=2^4$, a reduction of bit width for the digital signal by four bits can be achieved with no loss of signal information content. A one-bit oversampled signal can be produced from a multi-bit signal source to control a highly efficient class-D power amplifier for audio signals. Sigma-delta modulators can be implemented with analog circuits and comparators, but are often implemented with digital circuitry using digital signal processing techniques. The resulting circuit arrangements can accommodate the design of very compact and highly integrated circuits such as VCOs and data converters.

Illustrated in the block diagram in FIG. 2 is an exemplary analog sigma-delta modulator 200 of the prior art that produces an output signal $V_{out}$ from an analog input signal $V_{in}$. The modulator 200 includes a differential amplifier 210 that amplifies the difference between the input signal $V_{in}$ and the output signal $V_{out}$. An integrator 220 that may be arranged as part of the differential amplifier 210 integrates the amplified difference signal, and a comparator 230 swings the output voltage to the upper bias rail voltage of the comparator when the amplified and integrated difference signal is greater than a reference voltage $V_{ref}$, and to the lower bias rail voltage when the amplified and integrated difference signal is less than the voltage $V_{ref}$. The output voltage $V_{out}$ for an input signal $V_{in}$ is a rectangular voltage waveform that alternates in a seemingly random manner between the upper bias rail voltage and the lower bias rail voltage of the differential amplifier. The frequency of alternation is controlled by the gain A of the differential amplifier. For a constant input voltage $V_{in}$, the average output voltage is equal to the input voltage. The sigma-delta modulator in FIG. 2 is referred to as a first-order modulator because it includes one integrator.

Turning now to FIG. 3A, illustrated is a block diagram of another digital sigma-delta modulator 300 of the prior art with an input word X(n) representing a digital input signal at cycle n, and an output digital word Y(n) at cycle n. The digital sigma-delta modulator 300 is typically operated periodically to produce the output sequence Y(n), and can be implemented using digital signal processing techniques. The input signal X(n) and the output of the delay element 340 are subtracted in adder 310, and the cycle-to-cycle result is summed in the block 320. ("Adders" include "subtracters" which add digital inputs where one input has its sign reversed). Block 320, illustrated with Z-transform notation for a sampled-data system, represents a digital summing process, i.e., the block 320 is a digital "integrator" or digital "integration stage." The block 320 typically executes the equation $$L(n+1)=L(n)+U(n),$$

where U(n) and L(n) are, respectively, the input and output of the integrator at cycle n, and L(n+1) is the output of the integrator at cycle n+1. A quantizer 330 reduces the bit width of the output of the sigma-delta modulator to produce the output word L(n), which may only be a single bit. The delay element 340 executes the equation $$W(n)=Y(n-1),$$

where W(n) is the output from the delay element at cycle n, and Y(n−1) is the input to the delay element on the previous cycle. A delay element is digitally implemented by simply storing the input to the delay element and then reading it back one cycle later. The sigma-delta modulator illustrated in FIG. 3A thus produces a sequence of output words Y(n) that assumes values over a limited range, and with average value equal to the average value of the input signal X(n).

Sigma-delta modulators can be designed with "delaying integrators" or "non-delaying integrators". FIG. 3B illustrates a block diagram of a digital integrator arranged as a delaying integrator, which typically includes a summer 350 and a delay element 360 directly in the path between the input and the output. A non-delaying integrator is illustrated in the block diagram in FIG. 3C, which includes summer 370 and delay element 380 in the feedback path of the integrator.

Sigma-delta modulators are designed with higher orders of modulation particularly when the input signal is a time-varying waveform such as a voice, video, or data signal. Modulators of higher order as described below with reference to FIGS. 4A and 4B allow the output signal to track the input signal with improved accuracy.

A second-order digital sigma-delta modulator of the prior art is illustrated in the block diagram in FIG. 4A, including the two integrators 415 and 420. This modulator is referred to as a second-order modulator because it includes two integrators (or "integration stages"). By including a multiplicative gain M in block 410 in the feedback path, the average value of the output signal Y(n) is (1/M) times the value of the input signal X(n). The digital process for this modulator, as described by T. A. D. Riley, et al., in the paper entitled "Delta-Sigma Modulation in Fractional-N Frequency Synthesis," IEEE Journal of Solid-State Circuits, Vol. 28, No. 5, May 1993, uses 13 bits for the digital computation, which is increased to 14 bits in certain steps to accommodate numerical overflow in adders. The output signal Y(n) in this design is quantized to a bit width of one, and alternately assumes the values +1 and −1 after processing by quantizer 425.

FIG. 4B illustrates in a block diagram a third-order sigma-delta modulator 400 of the prior art including three integrators 430, 435, and 440. This modulator includes three forward signal paths with gain 2 in block 450, unity gain in block 451, and gain 0.25 in block 452. Quantizer 460 produces a one bit output signal Y(n) which alternates between the values +1 and −1. Feedback gain M=1024 in block 455 again produces an average value for the output signal Y(n) that is (1/M) times the average value of the input signal X(n).

Modulators with higher orders of integration come with increased cost for the digital circuit as measured by indicators such as die area, gate count, signal processing delay, and power dissipation. Such circuits are frequently implemented with independent adders, which have an inherent execution time for digital addition. Adders generally comprise the slower digital elements in the modulator circuit and are usually the principal contributors to signal processing delay.

A VCO controlled with a fractional-N frequency divider and a PLL are readily integrable in an IC (integrated circuit), enabling production of a compact and low-cost system with a precisely tuned oscillator. However, in low-power systems, particularly in portable systems, the digital sigma-delta modulator that drives the frequency divider generally consumes a substantial portion of the area and power of an IC (integrated circuit), which increases system cost and decreases battery life. Recognizing that applications of sigma-delta modulators include voltage-controlled oscillators in cellular telephones and in other portable radio transceivers, which serve large, competitive markets, a low-cost sigma-delta modulator that consumes little power, would provide a competitive advantage. Thus, what is needed in the art for both analog and digital applications is a sigma-delta modulator that can produce a high-frequency sequence of binary words with minimal signal processing and minimal power dissipation. Further, a need exists for an improved sigma-delta modulator that can advantageously be produced in an integrated circuit with low cost and with fast signal-processing speed, and which has less drain on the battery system for portable devices, or uses less power for other devices.

SUMMARY OF THE INVENTION

Embodiments of the present invention achieve technical advantages as a sigma-delta modulator that can be used to set the frequency for an adjustable-frequency oscillator, and can be used in other applications such as bit width reduction for a digital signal or conversion of an analog signal into a digital format.

In accordance with a preferred embodiment, the invention solves the problem of producing a digital output signal with reduced bit width from a digital input signal using a sigma-delta modulator with minimal die area and less power dissipation, or producing a digital output signal from an analog input signal using a sigma-delta modulator, again with minimal die area and less power dissipation.

Embodiments of the present invention achieve technical advantages as a digital sigma-delta modulator that can produce an output signal with minimal signal processing delay. In a preferred embodiment, a digital sigma-delta modulator, comprises an input node coupled to an input signal and an output node producing an output signal. In a preferred embodiment, a plurality of integration stages is coupled in tandem between the input node and the output node, wherein the bit width of a signal in an integration stage coupled closer to the input node is wider than the bit width of a signal in an integration stage coupled closer to the output node. In a further preferred embodiment, the bit width of signals in the plurality of integration stages coupled in tandem between the input node and the output node is progressively reduced. In a further preferred embodiment, the plurality of integration stages comprises three integration stages. In a further preferred embodiment, the output signal is quantized to three bits.

In a preferred embodiment, the digital sigma-delta modulator includes a feedforward path from an output of an integration stage to a summer coupled to the output node, wherein the gain of the feedforward path is an integer power of two. In a further preferred embodiment, the digital sigma-delta modulator includes a feedback path from the output node coupled to an integration stage, wherein the gain of the feedback path is an integer power of two. In a further preferred embodiment, the gain of the feedback path is unity. In a further preferred embodiment, an integration stage is a delaying integration stage.

In accordance with a preferred embodiment, a method of forming a digital sigma-delta modulator that can produce an output signal with minimal signal processing delay includes coupling an input node to an input signal and forming an output node to produce an output signal. In a preferred embodiment, the method includes coupling a plurality of integration stages in tandem between the input node and the output node, wherein the bit width of a signal in an integration stage coupled closer to the input node is wider than the bit width of a signal in an integration stage coupled closer to the output node. In a further preferred embodiment, the method includes progressively reducing the bit width of signals in the plurality of integration stages coupled in tandem between the input node and the output node. In a further preferred embodiment, the method includes using three integration stages for the plurality of integration stages. In a further preferred embodiment, the method includes quantizing the output signal to three bits.

In a preferred embodiment, the method includes constructing the digital sigma-delta modulator with a feedforward path from an output of an integration stage to a summer coupled to the output node, and setting the gain of the feedforward path to an integer power of two. In a further preferred embodiment, the method includes providing a feedback path from the output node of the digital sigma-delta modulator coupled to a negative input of an adder, coupling the output of the adder to an input of an integration stage, and setting the gain of the feedback path to an integer power of two. In a further preferred embodiment, the method includes setting the gain of the feedback path to unity. In a further preferred embodiment, the method includes using a delaying integration stage for an integration stage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an apparatus and method using a sigma-delta modulator that can produce a digital output signal with reduced bit width from a digital input signal with minimal die area and low power dissipation, or produce a digital output signal from an analog input signal with minimal die area and low power dissipation. However, the use of this specific context is for illustrative purposes and does not limit the scope of the invention or the appended claims.

The sigma-delta modulator of the invention can produce an output signal with minimal signal processing delay. The simplicity of the circuit of the invention and its execution speed accommodate high performance applications with very low cost and power dissipation.

Figure 1:
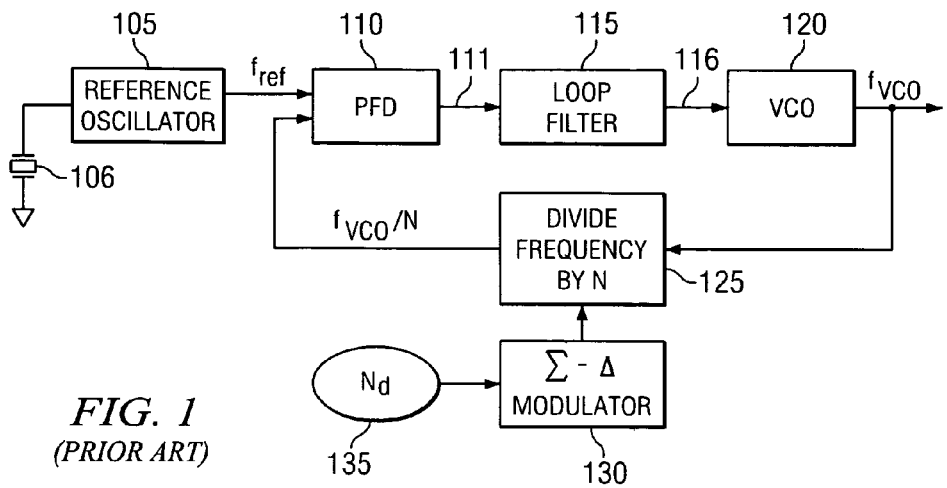
FIG. 1 illustrates an exemplary block diagram of an adjustable-frequency oscillator with a sigma-delta modulator coupled to a feedback loop to control the adjustable-frequency oscillator frequency.
Figure 2:
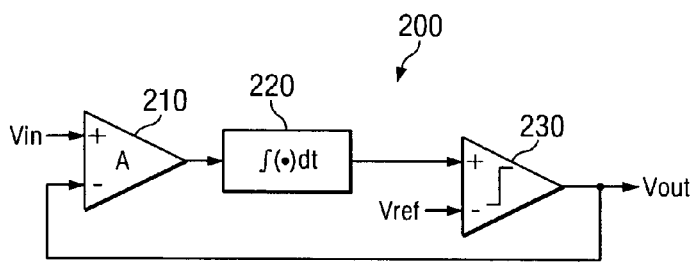
FIG. 2 illustrates a block diagram of a first-order sigma-delta modulator of the prior art.
Figure 3A:
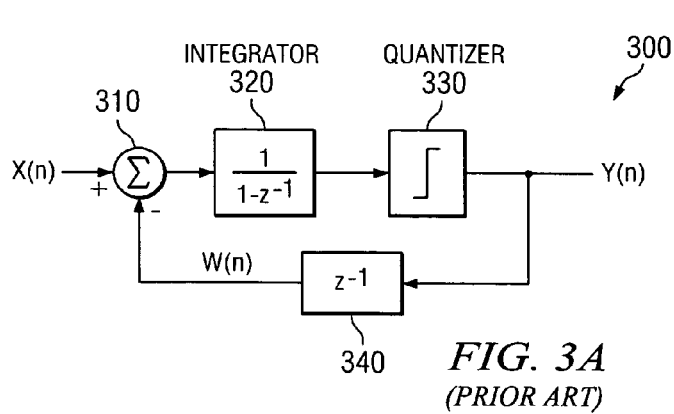
FIG. 3A illustrates a block diagram of a first-order digital sigma-delta modulator of the prior art.
Figure 3B:
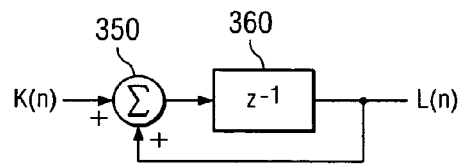
FIG. 3B illustrates a block diagram of a digital delaying integrator of the prior art.
Figure 3C:
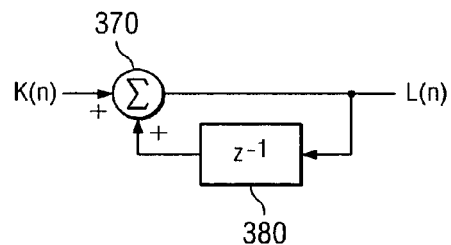
FIG. 3C illustrates a block diagram of a digital non-delaying integrator of the prior art.
Figure 4A:
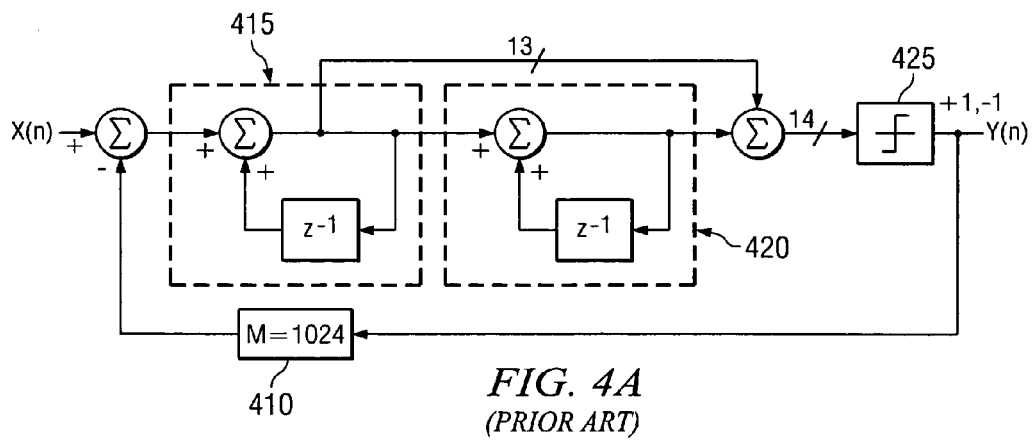
FIG. 4A illustrates a block diagram of second-order digital sigma-delta modulator of the prior art.
Figure 4B:
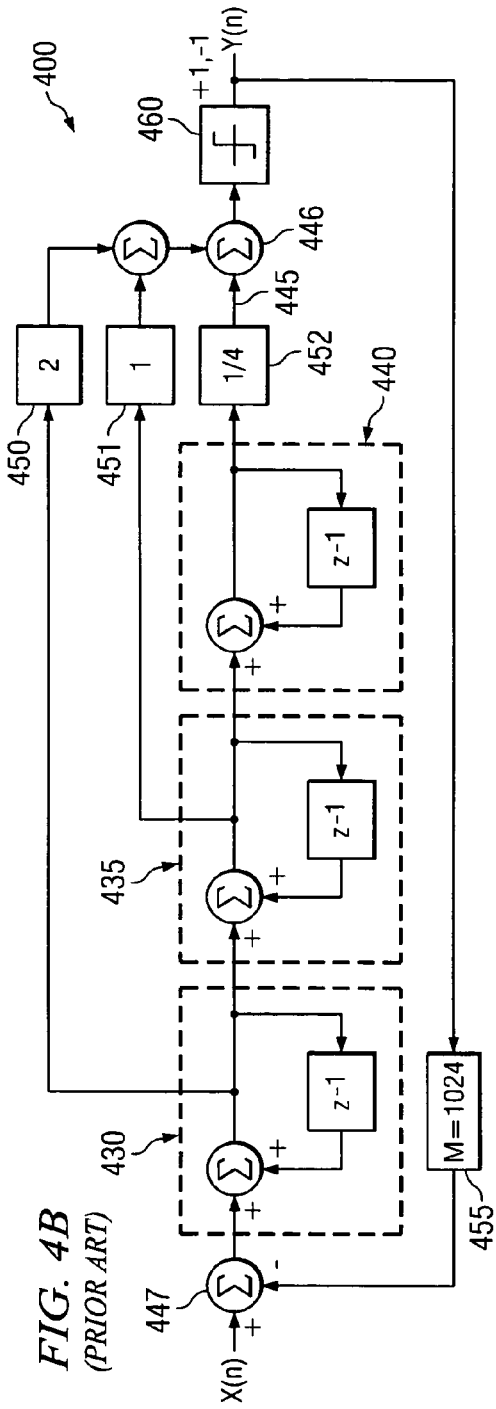
FIG. 4B illustrates a block diagram of third-order sigma-delta modulator of the prior art.

The design of a sigma-delta modulator requires consideration of various issues to implement a practical circuit. One issue for consideration is noise superimposed by the modulator on the output signal. The noise sensitivity to internal processing stages of a sigma-delta modulator, particularly the noise sensitivity to low-frequency noise sources, is high for the front-end signal processing elements such as the first integrator 430 illustrated in FIG. 4B. For example, an offset error of a first integrator such as a differential offset bias in a differential amplifier is essentially operative as a noise source with zero frequency. Offset error in a first integrator is directly reflected as an uncorrected offset error in the output signal. Subsequent integration stages such as the third integrator 440 illustrated in FIG. 4B contribute progressively lower noise to modulator output for low-frequency signals. The reduction in noise contribution occurs because the forward gain of the modulator becomes progressively smaller as an input signal is processed through the several stages in the forward path of the circuit. Therefore the later integration stages can have progressively relaxed noise characteristics, such as noise introduced by signal quantization, without substantially affecting the information content of the output signal. In an embodiment of the invention, later stages of the modulator introduce greater levels of noise due to coarser levels of quantization, whereby progressively fewer bits are used to perform the computation, i.e., the bit width of words representing signals is progressively reduced as the signal is processed in later stages. Thus the precision of the overall computation is progressively reduced, resulting in a reduced number of logic gates necessary to implement the circuit, thereby reducing die area, cost, and power dissipation. A low-pass filter in a later processing stage after the modulator that may reconstitute the signal or do further signal processing can readily attenuate remaining high-frequency noise components to advantageously substantially restore the quality of the signal coupled to the modulator input. Sigma-delta modulator circuits of the prior art use digital processes that process an input signal with digital word length that is substantially constant through the signal-processing chain of the modulator, which uses significant die area for the circuit and produces significant power dissipation, resulting in a costly or otherwise impractical modulator design.

A second area for sigma-delta modulator design consideration is its signal processing run time, which must be completed between successive cycles of operation. The overall signal processing run time (or processing delay) depends on the signal path through the modulator that includes the largest number of adders in a loop or between delay elements. For example in FIG. 4B, the path from node 445 through summer 446, through the quantizer 460 and the summer 447, through the three summers in the three integrators 430, 435, and 440, and back to node 445, includes five adders, which must each complete its addition before the next adder in line can start. This path through the five adders essentially sets the maximum rate at which the modulator 400 can be cycled. Third order sigma-delta modulator circuits of the prior art use circuit architectures that include five adders in a path that must each complete its operation between successive computational cycles.

A further consideration for modulator circuit simplicity is to implement constant multiplicative gains in the modulator with integer powers of two to simplify the multiplication. For example, feedback and feedforward gains should be integer power-of-two constants such as 1, 2, 4, or 0.5. In these cases, multiplication consists simply of bit shifting or bit selection, generally without the need for further numerical computation.

Figure 5:
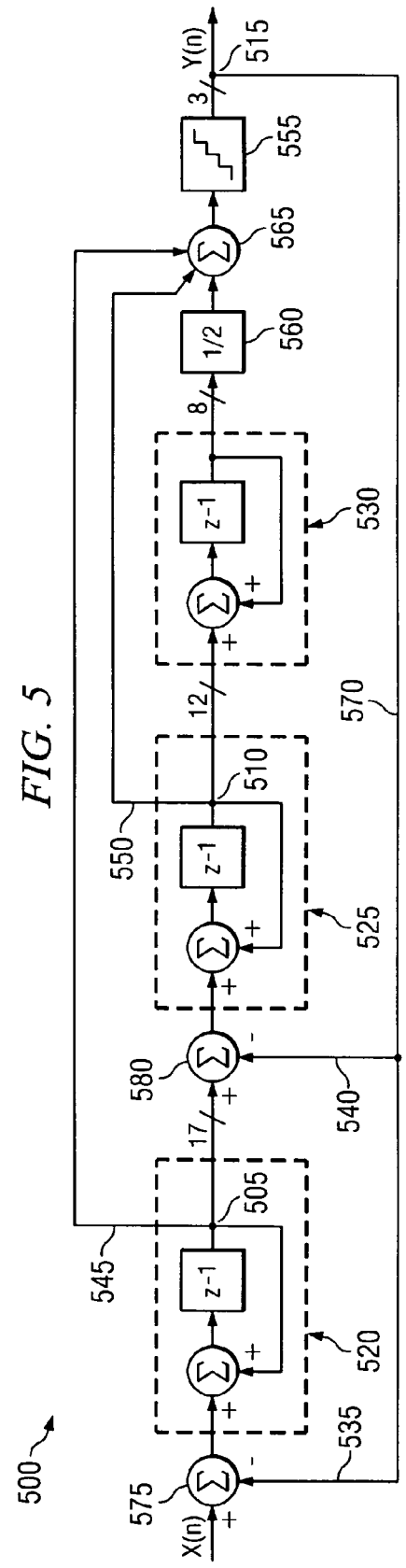
FIG. 5 illustrates a block diagram of a third-order sigma-delta modulator of the invention.

Illustrated in FIG. 5 is a block diagram of a sigma-delta modulator 500 of one embodiment of the invention. The sigma-delta modulator includes integrators 520, 525, and 530 that sequentially process sampled input signal X(n) through a forward path with three integrators to produce an output signal Y(n) quantized, without limitation, to three bits. Quantizer 555 represents reduction of the bit width of the output signal to three bits. A fixed gain of 0.5 in gain block 560 is included in the forward path with the three integrators. The modulator includes the additional feedforward paths 545 and 550, each with unity gain, that are summed with the forward path with the integrators in adder 565. Feedback path 570 with unity gain is coupled to the negative inputs of adders 575 and 580.

The sigma-delta modulator 500 advantageously processes the input signal X(n) with minimal digital computation by reducing bit width as the signal progresses through the modulator's forward path with the integrators. The reduction in bit width relies on the reduction of sensitivity to noise sources, such as quantization noise. The reduction of sensitivity to noise sources is a consequence of the high gain of the integrators at low frequencies. As the signal is processed and progresses from integrator to integrator, the remaining forward gain in the forward path with the integrators is substantially reduced. Thus, quantization of the input signal and digital processing in the first integrator represents the critical signal-processing stage that is advantageously performed with wide digital words for high precision.

In the embodiment illustrated in FIG. 5, the first integrator, 520, produces a 17-bit output, which is coupled to adder 580. The bit width of the signal in integrator 525 is reduced to 12 bits, which is coupled to integrator 530. The bit width in integrator 530 is further reduced and produces an output signal Y(n) comprising only three bits. The progressive reduction of the signal bit width through the modulator does not substantially affect the information content of the output signal due to the loss of gain in the integrators at low frequencies as the signal progresses through the feedforward path of the modulator. By optimizing the reduction in signal bit width in the modulator, the die area and power dissipation are one third that of previous designs, with only a minimal impact on modulator noise.

The modulator illustrated in FIG. 5 advantageously includes three delay integrators in the feedforward path to provide high tracking accuracy for time-varying input signals. The modulator includes a feedforward path to shape its response to time-varying input signals, preferably with unity gain, from the output of the first integrator to an adder after the third integrator. The modulator includes another feedforward path, also preferably with unity gain, from the output of the second integrator to the adder after the third integrator. Of course, an adder that sums three input signals such as the adder 565 can be implemented with two adders that each sum two input signals, as is well known in the art. The modulator 500 includes a feedback path 570, preferably with unity gain, from output node 515 coupled to the inverting input 535 to the adder 575, and to the inverting input 540 to the adder 580. The three-bit feedback paths 535 and 540 would be processed against the most significant bits of the non-inverting input signals to the adders 575 and 580 which have wider bit widths.

The structure of the modulator illustrated in FIG. 5 including the three delaying integrators provides no path through the modulator with more than three adders, thereby substantially reducing the processing delay from third-order modulators of the prior art by approximately 40%.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing efficient implementation of a sigma-delta modulator with simplified digital computation as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital sigma-delta modulator, comprising:
an input node coupled to an input signal;
a quantizer coupled to an output node;
the input node coupled to an input of a first adder;
an output of the first adder coupled to an input of a first integration stage;
an output of the first integration stage coupled to an input of a second adder;
an output of the second adder coupled to an input of a second integration stage;
an output of the second integration stage coupled to an input of a third integration stage;

inputs of a third adder coupled to the outputs of the first, second and third integration stages, and an output of the third adder coupled to the quantizer; and the output node coupled to inverting inputs of the first and second adders.

2. The digital sigma-delta modulator according to claim 1, further including a gain of 0.5 between the output of the third integration stage and the input of the third adder.

3. The digital sigma-delta modulator according to claim 1, wherein the bit width of the first integration stage is larger than the bit width of the second integration stage; and the bit width of the second integration stage is larger than the bit width of the third integration stage.

* * * * *